US011408943B2

(12) United States Patent
He et al.

(10) Patent No.: US 11,408,943 B2
(45) Date of Patent: Aug. 9, 2022

(54) TRANSFORMER STATE EVALUATION METHOD COMBINING FAHP METHOD, DEMATEL METHOD AND CRITIC METHOD

(71) Applicant: WUHAN UNIVERSITY, Hubei (CN)

(72) Inventors: Yigang He, Hubei (CN); Wei Wu, Hubei (CN); Jin Tong, Hubei (CN); Chaolong Zhang, Hubei (CN)

(73) Assignee: WUHAN UNIVERSITY, Hubei (CN)

(*) Notice: Subject to any disclaimer, the term of this patent is extended or adjusted under 35 U.S.C. 154(b) by 0 days.

(21) Appl. No.: 17/161,667

(22) Filed: Jan. 29, 2021

(65) Prior Publication Data

US 2021/0373086 A1 Dec. 2, 2021

(30) Foreign Application Priority Data

May 26, 2020 (CN) .......................... 202010455962.1

(51) Int. Cl.
*G01R 31/62* (2020.01)
*G01R 27/16* (2006.01)

(52) U.S. Cl.
CPC ............. *G01R 31/62* (2020.01); *G01R 27/16* (2013.01)

(58) Field of Classification Search
CPC ......... G01R 31/62; G01R 27/16; G06F 30/20; G06F 2119/02; G06Q 50/06
USPC ....................................................... 324/726
See application file for complete search history.

(56) References Cited

U.S. PATENT DOCUMENTS

2007/0021955 A1* 1/2007 Tolone .................... G06F 30/20
703/22
2019/0036339 A1* 1/2019 Wong ........................ H02J 3/14

OTHER PUBLICATIONS

L. Sun, et al., An Integrated Decision-Making Model for Transformer Condition Assessment Using Game Theory and Modified Evidence Combination Extended by D Numbers, 2016 Energies 9:697 (Aug. 31, 2016) (available at: https://doi.org/10.3390/en9090697) (Year: 2016).*
Q. Xie et al., Large Power Transformer Condition Evaluation Based on Multilevel Extension Theory, 2008 DRPT (Apr. 6-9, 2008) (Year: 2008).*

(Continued)

*Primary Examiner* — Tung X Nguyen
*Assistant Examiner* — Robert P Alejnikov, Jr.
(74) *Attorney, Agent, or Firm* — JCIPRNET

(57) ABSTRACT

A transformer state evaluation method combining a FAHP method, a DEMATEL method, and a CRITIC method is provided and includes: selecting a plurality of groups of state quantities, building a hierarchical indicator system; calculating an influencing degree and an influenced degree by using the DEMATEL method on a subjective level, calculating a weight of each of a plurality of indicators of an indicator layer through the FAHP method and the DEMATEL method, calculating the weights of the indicators of the indicator layer through the CRITIC method on an objective level; calculating an optimal weight according to the indicator subjective weights and the indicator objective weights; and calculating state scores layer by layer, finally determining an actual health condition of each of a plurality of transformers by combining state level classification rules. In the disclosure, the weights are calculated based on the subjective level and the objective level.

7 Claims, 1 Drawing Sheet

(56) References Cited

OTHER PUBLICATIONS

Y. Li et al., Evaluating the Power Grid Investment Behavior in China: From the Perspective of Government Supervision, 2019 Energies 12:4192 (Nov. 2, 2019) (available at doi:10.3390/en12214192) (Year: 2019).*

A.R. Krishnan et al., A Modified CRITIC Method to Estimate the Objective Weights of Decision Criteria, 2021 Symmetry 13:973 (May 31, 2021) (available at: https://doi.org/10.3390/sym13060973) (Year: 2021).*

* cited by examiner

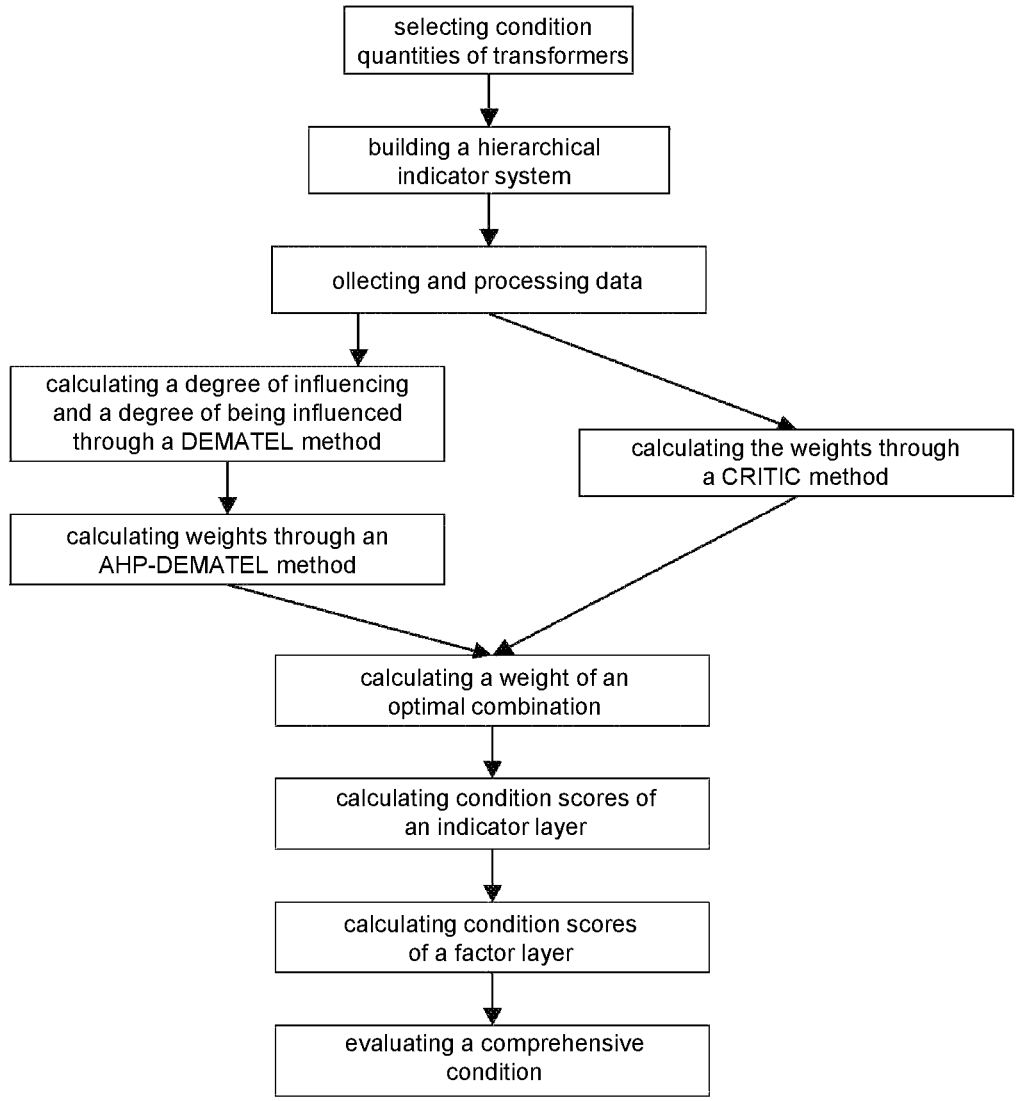

TRANSFORMER STATE EVALUATION METHOD COMBINING FAHP METHOD, DEMATEL METHOD AND CRITIC METHOD

CROSS-REFERENCE TO RELATED APPLICATION

This application claims the priority benefit of China application serial no. 202010455962.1, filed on May 26, 2020. The entirety of the above-mentioned patent application is hereby incorporated by reference herein and made a part of this specification.

BACKGROUND

Technical Field

The disclosure relates to a transformer state evaluation field, and in particular, relates to a transformer state evaluation method combining a fuzzy analytic hierarchy process (FAHP), a decision making trial and evaluation laboratory (DEMATEL) method, and a criteria importance through intercriteria correlation (CRITIC) method.

Description of Related Art

The safety of transformers is an important factor for the normal operation of a power grid. In order to prevent transformer failures, time for maintenance and repair of the transformers may be determined in a timely and reasonable manner, and the level of operation and maintenance of the power transformers may be improved, and these are important issues to be addressed. At present, among the several maintenance strategies which are currently available, the most advanced and cost-saving maintenance strategy is to rely on the state evaluation close to the actual operation state of the transformers, and that the maintenance time and plan may be accordingly selected.

Nevertheless, a transformer has a complex structure and exhibits a large number of state quantities, and further, interference occurs among indicator quantities. As affected by the above-mentioned problems, it is difficult to achieve accurate evaluation of transformer states. When calculating the weights of evaluation indicators through a conventional method, interference among indicators is ignored. In order to reduce the evaluation deviation caused by the mutual influence among evaluation indicators, in the disclosure, the fuzzy analytic hierarchy process (FAHP), a decision making trial and evaluation laboratory (DEMATEL) method, and the criteria importance through intercriteria correlation (CRITIC) method are combined. The weights of the indicators are calculated from a subjective level and an objective level to reduce the interference. In this way, the evaluation result that is closest to the actual health conditions of the transformers may be accordingly obtained.

SUMMARY

The disclosure aims to solve the technical problem of inaccurate final evaluation results caused by mutual interference among evaluation indicators and provides a transformer state evaluation method combining a fuzzy analytic hierarchy process (FAHP), a decision making trial and evaluation laboratory (DEMATEL) method, and a criteria importance through intercriteria correlation (CRITIC) method.

The technical solutions adopted by the disclosure includes the following.

The disclosure provides a transformer state evaluation method combining a FAHP method, a DEMATEL method, and a CRITIC method, and the method includes the following steps.

In step one, a plurality of groups of state quantities, which are most relevant to a transformer health condition is selected, and a hierarchical indicator system is built.

In step two, an influencing degree and an influenced degree of a plurality of state quantity indicators are calculated through the DEMATEL method, and a weight of each of the state quantity indicators are calculated through the FAHP method. Indicator subjective weights are obtained by combining the influencing degree and the influenced degree of the state quantity indicators. A plurality of groups of transformers and state quantity indicators corresponding to the plurality of groups of transformers are selected, and indicator objective weights are calculated through the CRITIC method.

In step three, an optimal weight is calculated according to the indicator subjective weights and the indicator objective weights, such that a total difference value between a weight vector obtained through the optimal weight and a weight vector obtained through each of methods is minimum.

In step four, a state score is calculated layer by layer from an indicator layer to a factor layer for each of the transformers to be evaluated according to the hierarchical indicator system and the optimal weights, which are obtained, the state score of each of the transformers is weighted and obtained, and an actual health condition of each of the transformers is determined through the state score of each of the transformers.

In an embodiment of the disclosure, a method of building the hierarchical indicator system in the step one specifically includes the following steps.

24 groups of the state quantities, which are most relevant to the transformer health condition are selected, and the hierarchical indicator system is built. The hierarchical indicator system is divided into three layers from top to bottom: a target layer, the factor layer, and the indicator layer. The target layer is a comprehensive state of the transformers. 9 failure types, which are most influential to the states of the transformers are selected in the factor layer, and a plurality of specific variables, which are most influential in the failure types, are selected in the indicator layer.

In an embodiment of the disclosure, in a method of building the target layer, the factor layer, and the indicator layer in the step one:

The target layer is the comprehensive state of the transformers.

The factor layer is: a winding failure, a core failure, arc discharging, partial discharging, oil discharging, insulation damping, insulation aging, insulation oil deterioration, and current loop overheating.

The indicator layer is: dielectric loss of insulation oil, a water content in oil, an oil breakdown voltage, an insulation resistance absorption ratio, a polarization indicator, a volume resistivity H2, a core ground current, a core insulation resistance, $C_2H_6$, $C_2H_4$, a mutual difference of winding direct current resistance, CO, a relative gas production rate, $CO_2$, a relative gas production rate, an initial value difference of winding short-circuit impedance, winding insulation dielectric loss, an initial value difference of winding capacitance, $C_2H_2$, a partial discharging amount, a gas content in oil, $CH_4$, a neutral point oil flow static current, a furfural content, and a cardboard polymerization degree.

In an embodiment of the disclosure, a method of obtaining the indicator subjective weights in the step two specifically includes the following steps.

The influencing degree and the influenced degree of indicators are calculated for the indicators under the factor layer by using the DEMATEL method. A direct influence matrix A of the indicators is determined for the indicators under the factor layer by using an expert scoring method, and a variable a is an element in the direct influence matrix A.

Normalization is performed through $$G = A \Big/ \max_{1 \leq i \leq n} \sum_{j=1}^{n} a_{ij}$$

to obtain a matrix G, where n is a number of the state quantity indicators under the factor layer. A comprehensive influence matrix is calculated through $T=G(I-G)^{-1}$, where a variable t is an element in a comprehensive influence matrix T.

An influencing degree $f_i$ and an influenced degree $e_i$ are determined through a formula $$f_i = \sum_{j=1}^{n} t_{ij}, \quad e_i = \sum_{i=1}^{n} t_{ij}.$$

$f_i$ is a sum of row elements in the comprehensive influence matrix T, indicating a direct influencing degree or an indirect influencing degree of a state quantity indicator i on a state quantity indicator j, and $e_i$ is a sum of column elements in the comprehensive influence matrix T, indicating a value of the state quantity indicators corresponding to each row influenced by other state quantity indicators.

A state quantity weight $W^1$ is calculated through the FAHP method, a relationship matrix between the influencing degree and the influenced degree is obtained through the DEMATEL method according to a formula d=fT*e, a vector of the influencing degree d=fT*e of the indicators is formed through a diagonal line element, the influencing degree of the indicator i is calculated, and a corresponding weight $W^2$ is obtained through a formula $$W^2 = d_i \Big/ \sum_{i=1}^{n} d_i.$$

The DEMATEL method and the FAHP method are combined, a weight W is obtained through a formula $W=W^1 \square W^2$, and a comprehensive weight $\overline{W}$, which is, the indicator subjective weight which is obtained after performing normalization.

In an embodiment of the disclosure, a method of calculating the indicator objective weights in the step two specifically includes the following steps.

The plurality of groups of the transformers and the state quantities thereof are selected, standardization processing is performed on state quantity data of each of the transformers, and a formula thereof is: standardized quantity=(this value-lowest value)/(highest value-lowest value).

A contrast intensity $\sigma_j$, conflict $R_j$, and an information amount $C_j$ are calculated through formulas provided as follows:

$$R_j = \sum_{i=1}^{n}(1 - r_{ij})$$

$$C_j = \sigma_j R_j$$

The contrast intensity is a difference between a same indicator of different individuals, and a standard deviation is used to represent the contrast intensity $\sigma_j$.

An objective weight $W_j$ is obtained through calculating a formula provided as follows:

$$W_j = \frac{C_j}{\sum_{j=1}^{n} C_j}$$

where i and j represent the state quantities, n represents a total number of the state quantities, and $r_{ij}$ represents a correlation coefficient provided between the state quantities i and j.

In an embodiment of the disclosure, a method of calculating the optimal weight in the step three specifically includes the following steps.

The optimal weight is calculated according to the indicator subjective weights and the indicator objective weights, which are obtained by calculating, based on a minimum-variance principle through a method of Lagrange multipliers for finding an extremum. The total difference value between the weight vector obtained through the optimal weight and the weight vector obtained through each of methods is minimum. A method of calculating the optimal weight is provided as follow.

A weight vector of a $j^{th}$ indicator of one weight calculation method is Wj=(Wj1, Wj2, Wj3, ..., Wjn), a most reasonable attribute weight vector under weighting of two weight calculation methods is W=(W1, W2, W3, ... Wm), m and n are both numbers of indicators of one factor layer, and a single-target planning model is accordingly built:

$$\begin{cases} \min P = \sum_{i=1}^{m} \sum_{k=1}^{s} \sum_{j=1}^{n} (a_k \lambda_{ki} - a_j \lambda_{ij})^2 \\ \sum_{k=1}^{s} a_k = 1 \end{cases}$$

A corresponding Lagrangian function is constructed, and the extremum is found:

$$L(a, \lambda) = \sum_{i=1}^{m} \sum_{k=1}^{s} \sum_{j=1}^{n} (a_k u_{ki} - a_j u_{ij})^2 + \lambda \left( \sum_{k=1}^{s} a_k - 1 \right),$$

and
the following may be derived:

$$\frac{\partial L(a, \lambda)}{\partial a_k} = 2 a_k \sum_{i=1}^{m} u_{ki}^2 - \left( a_1 \sum_{i=1}^{m} u_{1i} u_{ki} + a_2 \sum_{i=1}^{m} u_{2i} u_{ki} \right) + \frac{\lambda}{2} = 0$$

$$\frac{\partial L(a, \lambda)}{\partial \lambda} = \sum_{t=1}^{s} a_t - 1 = 0,$$

when k=1 and 2, a system of equations formed by 3 unknowns and 3 equations is constructed, the two methods respectively account for a=(a1, a2) of the weighting after solving the system of equations, and that an optimal weight vector is accordingly obtained.

In an embodiment of the disclosure, a method of calculating the state scores in the step four specifically includes the following steps.

The state scores are calculated in the indicator layer according to data values of the transformers, which are to be evaluated, and a calculation expression for calculating the state scores in the indicator layer is provided as follows:

$$x_i = \frac{z - z_n}{z - z_f},$$

where $x_i$ is the state score of an indicator, when $x_i<0$, let $x_i=0$, when $x_i>1$, take $x_i=1$, z is an attention value, $z_n$ is an experimental value of this time, and $z_f$ is an initial value of the state quantity indicator.

A state score $X_i$ of the factor layer is calculated through weighting by using known weights and the state scores of the indicator layer. A fuzzy determination matrix of the factor layer is built by using the state scores of the failure types of the factor layer, weights of the failure types of the factor layer are obtained according to the fuzzy determination matrix, the state scores of the transformers are finally obtained through weighting and calculating.

The fuzzy determination matrix of the failure types is:

$$R_A = \begin{pmatrix} r_{11} & r_{12} & \cdots & r_{1N} \\ r_{21} & r_{22} & \cdots & r_{2N} \\ \vdots & \vdots & & \vdots \\ r_{N1} & r_{N2} & \cdots & r_{NN} \end{pmatrix},$$

and
a calculation formula of an internal element $r_{ij}$ is:

$$r_{ij} = \frac{X_i}{X_i + X_j}.$$

BRIEF DESCRIPTION OF THE DRAWINGS

The disclosure is further described in detail in combination with accompanying figures and embodiments, and the following figures are provided.

FIG. 1 is a specific flow chart of evaluating states of transformers according to an embodiment of the disclosure.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure.

As shown in FIG. 1., a transformer state evaluation method combining a fuzzy analytic hierarchy process (FAHP), a decision making trial and evaluation laboratory (DEMATEL) method, and a criteria importance through intercriteria correlation (CRITIC) method includes the following steps.

In step one, a plurality of groups of state quantities, which are most relevant to a transformer health condition is selected, and a hierarchical indicator system is built.

In step two, an influencing degree and an influenced degree of a plurality of state quantity indicators are calculated through the DEMATEL method, and a weight of each of the state quantity indicators are calculated through the FAHP method. Indicator subjective weights are obtained by combining the influencing degree and the influenced degree of the state quantity indicators. A plurality of groups of transformers and state quantity indicators corresponding to the plurality of groups of transformers are selected, and indicator objective weights are calculated through the CRITIC method.

In step three, an optimal weight is calculated according to the indicator subjective weights and the indicator objective weights, such that a total difference value between a weight vector obtained through the optimal weight and a weight vector obtained through each of methods is minimum.

In step four, a state score is calculated layer by layer from an indicator layer to a factor layer for each of the transformers to be evaluated according to the hierarchical indicator system and the indicator optimal weights, which are obtained, the state score of each of the transformers is weighted and obtained, and an actual health condition of each of the transformers is determined through the state score of each of the transformers.

In the disclosure, a state evaluation model of the transformers is built first, and level standards are classified. Next, the DEMATEL method is combined with the FAHP method on a subjective level, the CRITIC method is adopted for calculating a weight on an objective level, and the optimal weight is calculated by adopting an optimal weigh calculation method. Finally, the state scores are calculated layer by layer, final state scores of the transformers are obtained, and states of the transformers may thus be accordingly evaluated.

With reference to Table 1, a transformer state evaluation indicator system is built. With reference to Table 2, corresponding relationships between the health conditions and the state scores of the transformers are provided. The indicator system is divided into three layers from top to bottom: a target layer, the factor layer, and the indicator layer. The target layer is a comprehensive state of the transformers. 9 failure types, which are influential to the states of the transformers are selected in the factor layer, and these failure types are: a winding failure, a core failure, arc discharging, partial discharging, oil discharging, insulation damping, insulation aging, insulation oil deterioration, current loop overheating. A plurality of specific variables having significant influencing factors in the failure types are selected in the indicator layer, and these specific variables are: dielectric loss of insulation oil, a water content in oil, an oil breakdown voltage, an insulation resistance absorption ratio, a polarization indicator, a volume resistivity H2, a core ground current, a core insulation resistance, $C_2H_6$, $C_2H_4$, a mutual difference of winding direct current resistance, CO, a relative gas production rate, $CO_2$, a relative gas production rate, an initial value difference of winding short-circuit impedance, winding insulation dielectric loss, an initial value difference of winding capacitance, $C_2H_2$, a partial discharging amount, a gas content in oil, CH4, a neutral point oil flow static current, a furfural content, and a cardboard polymerization degree.

TABLE 1

Transformer Evaluation Indicator System

| Target Layer | Factor Layer | Indicator Layer |
|---|---|---|
| Transformer Condition | winding failure a1 | H2 content a11, winding insulation dielectric loss a12, initial value difference of winding capacitance a13, initial value difference of winding short-circuit impedance a14 |
| | core failure a2 | core ground current a21, core insulation resistance a22, C2H6 content a23, C2H4 content a24 |
| | arc discharge a3 | H2 content a31, mutual difference of winding direct current resistance a32, C2H2 content a33, partial discharge amount a34 |
| | partial discharge a4 | water content in oil a41, H2 content a42, mutual difference of winding direct current resistance a43, partial discharge amount a44, gas content in oil a45, CH4 content a46, |
| | oil discharge a5 | dielectric loss of insulation oil a51, volume resistivity a52, C2H2 content a53, gas content in oil a54, neutral point oil flow static current a55 |
| | insulation damping a6 | dielectric loss of insulation oil a61, insulation resistance absorption ratio a62, core insulation resistance a63, volume resistivity a64, water content in oil a65, oil breakdown voltage a66, polarization indicator a67, H2 content a68, |
| | insulation aging a7 | dielectric loss of insulation oil a71, volume resistivity a72, winding insulation dielectric loss a73, gas content in oil a74, furfural content a75, cardboard polymerization degree a76 |
| | insulation oil deterioration a8 | dielectric loss of insulation oil a81, core insulation resistance a82, gas content in oil a83, water content in oil a84, oil breakdown voltage a85, volume resistivity a86 |
| | current loop overheating a9 | CO2 relative gas production rate a91, mutual difference of winding direct current resistance a92, C2H4 content a93, CO relative gas production rate a94, |

TABLE 2

Corresponding Relationships between Health Conditions and Condition Scores of Transformers

| Condition Score | 0 to 0.2 | 0.2 to 0.6 | 0.6 to 0.8 | 0.8 to 1.0 |
|---|---|---|---|---|
| Health Condition | severe | abnormal | attention required | normal |

The influencing degree and the influenced degree of indicators are calculated by using the DEMATEL method. Each factor is determined by using a Delphi method, and a direct influence matrix A (a variable a is an element in A) among the factors is determined. Normalization is performed through $$G = A \bigg/ \max_{1<i<n} \sum_{j=1}^{n} a_{ij}$$

to obtain a matrix G, and a comprehensive influence matrix is calculated through $T=G(I-G)^{-1}$ (a variable t is an element in T). Finally, an influencing degree $f_i$ and an influenced degree $e_i$ are determined through a formula $$f_i = \sum_{j=1}^{n} t_{ij}, \ e_i = \sum_{i=1}^{n} t_{ij}.$$

A weight $W^1$ of each of the state quantities is calculated through the FAHP method, as shown in Table 5.

TABLE 5

Weights of Condition Quantity of Winding Failure through FAHP Method

| Indicator | Weight |
|---|---|
| H2 content | 0.2411 |
| winding insulation dielectric loss | 0.2501 |
| initial value difference of winding capacitance | 0.2536 |
| initial value difference of winding short-circuit impedance | 0.2553 |

A relationship matrix between the influencing degree and the influenced degree is obtained through the DEMATEL method according to a formula d=fT*e. A vector of the influencing degree d=fT*e of the indicators is formed through a diagonal line element, and the influencing degree of an indicator i is calculated. A corresponding weight $W^2$ is obtained through a formula $$W^2 = d_i \bigg/ \sum_{i=1}^{n} d_i.$$

Finally, the DEMATEL method and the FAHP method are combined. A weight W is obtained through a formula $W=W^1 \square W^2$ and a comprehensive weight $\overline{W}$ is obtained after the normalization is performed.

With reference to Table 3, weights are assigned to 24 pieces of state quantity data of four different groups of transformers through the CRITIC method.

TABLE 3

Condition Quantity Data of Transformers

| Single Condition Quantity | Transformer 1 | Transformer 2 | Transformer 3 | Transformer 4 |
|---|---|---|---|---|
| dielectric loss of insulation oil (%) | 1.7 | 0.5 | 4.86 | 3.5 |
| water content in oil (mg/L) | 12.1 | 3.5 | 30.5 | 10.8 |
| oil breakdown voltage (Kv) | 55 | 58 | 37 | 50.8 |
| insulation resistance absorption ratio | 1.61 | 2 | 0.89 | 1.58 |

TABLE 3-continued

Condition Quantity Data of Transformers

| Single Condition Quantity | Transformer 1 | Transformer 2 | Transformer 3 | Transformer 4 |
|---|---|---|---|---|
| polarization indicator | 2.03 | 2.5 | 1.07 | 2.28 |
| volume resistivity ($10^9 \Omega \cdot m$) | 55 | 60 | 8.83 | 57.6 |
| $H_2$ (uL/L) | 359 | 6.1 | 166 | 282 |
| core ground current (A) | 3.8 | 0.01 | 0.04 | 2.49 |
| core insulation resistance (MΩ) | 200 | 1 000 | 300 | 420 |
| $C_2H_6$ (uL/L) | 92 | 2.3 | 5.3 | 88.2 |
| $C_2H_4$ (uL/L) | 52 | 4.8 | 3.1 | 51.6 |
| mutual difference of winding direct current resistance (%) | 1.5 | 1 | 1.2 | 2.8 |
| CO relative gas production rate (%/month) | 12 | 0 | 13 | 15 |
| CO2 relative gas production rate (%/month) | 31 | 0 | 58 | 33 |
| initial value difference of winding short-circuit impedance (%) | 1.2 | 1 | 1.1 | 1.1 |
| winding insulation dielectric loss (%) | 0.36 | 0.17 | 0.26 | 0.41 |
| initial value difference of winding capacitance (%) | 1.4 | 1 | 1.4 | 1.5 |
| $C_2H_2$ (uL/L) | 0 | 0 | 0 | 0.2 |
| partial discharge amount (pC) | 72 | 30 | 61 | 107 |
| gas content in oil (%) | 1.6 | 1 | 1.6 | 1.57 |
| $CH_4$ (uL/L) | 18.5 | 8.7 | 13.8 | 16.6 |
| neutral point oil flow static current (uA) | 0.07 | 0.02 | 0.05 | 0.21 |
| furfural content (mg/L) | 0.05 | 0 | 0.02 | 0.05 |
| cardboard polymerization degree | 900 | 1 000 | 980 | 920 |

The state quantity data of each of the transformers is shown in Table 3. Data of Table 3 is standardized through "standardized quantity=(this value-lowest value)/(highest value-lowest value)", and the corresponding contrast intensity, conflict, information amount, and objective weight are calculated and obtained according to formulas (1), (2), and (3).

$$R_j = \sum_{i=1}^{n}(1 - r_{ij}) \quad (1)$$

$$C_j = \sigma_j R_j \quad (2)$$

$$W_j = \frac{C_j}{\sum_{j=1}^{n} C_j} \quad (3)$$

Table 4 shows the contrast intensity, conflict, information amounts, and objective weights calculated and obtained through the CRITIC method of 4 indicators under the winding failure.

TABLE 4

Contrast Intensity, Conflict, Information Amounts, and Objective Weights among Condition Quantities

| Indicator | Contrast Intensity (σ) | Conflict (Rj) | Information Amount ($C_j$) | Objective Weight ($W_j$) |
|---|---|---|---|---|
| H2 content | 0.4351 | 0.2947 | 0.1282 | 0.1573 |
| winding insulation dielectric loss | 0.4449 | 0.4689 | 0.2086 | 0.2559 |
| initial value difference of winding capacitance | 0.4435 | 0.5272 | 0.2338 | 0.2869 |

TABLE 4-continued

Contrast Intensity, Conflict, Information Amounts, and Objective Weights among Condition Quantities

| Indicator | Contrast Intensity (σ) | Conflict (Rj) | Information Amount ($C_j$) | Objective Weight ($W_j$) |
|---|---|---|---|---|
| initial value difference of winding short-circuit impedance | 0.4082 | 0.5987 | 0.2444 | 0.2999 |

A correlation coefficient $r_{ij}$ is provided between the state quantities i and j, and a calculation method is provided as follows:

$$r_{xy} = \frac{\sum (x - \bar{x})(y - \bar{y})}{[\sum (x - \bar{x})^2 (y - \bar{y})^2]^{1/2}} \quad (4)$$

After the weights of the indicators are calculated by using two methods, the optimal weight is calculated based on a minimum-variance principle through a method of Lagrange multipliers for finding an extremum. The total difference value between the weight vector obtained through the optimal weight and a weight vector obtained by each of methods is minimum.

The state scores are calculated in the indicator layer according to actual data values of the transformers, and a calculation expression of the state scores is:

$$x_i = \frac{z - z_n}{z - z_f} \quad (5)$$

where $x_i$ is the state score of an indicator, when $x_i<0$, let $x_i=0$, when $x_i>1$, take $x_i=1$, z is an attention value, $z_n$ is an experimental value of this time, and $z_f$ is an initial value of the state quantity indicator.

Next, the state scores of the factor layer are calculated by using known weights and the state scores of the indicator layer, as shown in Table 6.

TABLE 6

Condition Scores of Factor Layer

| Failure Type | Condition Score |
|---|---|
| winding failure | 0.7445 |
| core failure | 0.0404 |
| arc discharge | 0.6570 |
| partial discharge | 0.6516 |
| oil discharge | 0.8437 |
| insulation damping | 0.5120 |
| insulation aging | 0.7697 |
| insulation oil deterioration | 0.6379 |
| current loop overheating | 0.5910 |

A fuzzy determination matrix of the factor layer is built by using the state scores of the failure types of the factor layer, and weights of the failure types of the factor layer are shown in Table 7. The state scores of the transformers are finally obtained through weighting and calculating. The actual health conditions of the transformers are determined through the state scores of the transformers.

TABLE 7

Weighted Values of Failure Types of Factor Layer

| Failure Type | Weighted Value |
|---|---|
| winding failure | 0.0927 |
| core failure | 0.2094 |
| arc discharge | 0.0998 |
| partial discharge | 0.1003 |
| oil discharge | 0.0857 |
| insulation damping | 0.1139 |
| insulation aging | 0.0908 |
| insulation oil deterioration | 0.1015 |
| current loop overheating | 0.1058 |

In view of the foregoing, through the transformer state evaluation method combining the FAHP method, the DEMATEL method, and the CRITIC method provided by the disclosure, interference between a target to be tested and the indicator values may be reduced, and therefore, stable evaluation results are provided, and incorrect diagnosis is prevented from occurring.

Effects produced by the disclosure includes the following.

(1) The evaluation method adopts the FAHP method and the DEMATEL method to calculate the weights of the indicators from a subjective level, adopts the CRITIC method to calculate the weights of the indicators from an objective level, and combines the two to obtain the optimal weight. In this way, the final weight calculation result is ensured to be close to the actual state, and calculation deviation caused by human subjective factors is also lowered.

(2) Compared to a conventional evaluation method, through the evaluation method provided by the disclosure, when the weights of the indicators are calculated, errors of the final evaluation result caused by mutual interference among selected state quantities are reduced. Therefore, an accurate and stable evaluation result is provided.

To make the aforementioned more comprehensible, several embodiments accompanied with drawings are described in detail as follows.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transformer state evaluation method combining a fuzzy analytic hierarchy process (FAHP), a decision making trial and evaluation laboratory (DEMATEL) method, and a criteria importance through intercriteria correlation (CRITIC) method, comprising:

step one: selecting a plurality of groups of state quantities, which are most relevant to a transformer health condition, and building a hierarchical indicator system;

step two: calculating an influencing degree and an influenced degree of a plurality of state quantity indicators through the DEMATEL method, calculating a weight of each of the state quantity indicators through the FAHP method, obtaining indicator subjective weights by combining the influencing degree and the influenced degree of the state quantity indicators; selecting a plurality of groups of transformers and state quantity indicators corresponding to the plurality of groups of transformers; and calculating indicator objective weights through the CRITIC method;

step three: calculating an optimal weight according to the indicator subjective weights and the indicator objective weights, such that a total difference value between a weight vector obtained through the optimal weight and a weight vector obtained through each of methods is minimum; and step four: calculating a state score layer by layer from an indicator layer to a factor layer for each of the transformers to be evaluated according to the hierarchical indicator system and the indicator optimal weights, which are obtained, obtaining the state score of each of the transformers through weighting, determining an actual health condition of each of the transformers through the state score of each of the transformers.

2. The transformer state evaluation method combining the FAHP method, the DEMATEL method, and the CRITIC method according to claim 1, wherein a method of building the hierarchical indicator system in the step one specifically comprises:

selecting 24 groups of the state quantities, which are most relevant to the transformer health condition, and building the hierarchical indicator system, wherein the hierarchical indicator system is divided into three layers from top to bottom: a target layer, the factor layer, and the indicator layer, the target layer is a comprehensive state of the transformers, 9 failure types, which are most influential to the states of the transformers are selected in the factor layer, and a plurality of specific variables, which are most influential factors in the failure types, are selected in the indicator layer.

3. The transformer state evaluation method combining the FAHP method, the DEMATEL method, and the CRITIC method according to claim 2, wherein a method of building the target layer, the factor layer, and the indicator layer in the step one specifically is, the target layer is the comprehensive state of the transformers, the factor layer is: a winding failure, a core failure, arc discharging, partial discharging, oil discharging, insulation damping, insulation aging, insulation oil deterioration, and current loop overheating, and the indicator layer is: dielectric loss of insulation oil, a water content in oil, an oil breakdown voltage, an insulation resistance absorption ratio, a polarization indicator, a volume resistivity H2, a core ground current, a core insulation resistance, C2H6, C2H4, a mutual difference of winding direct current resistance, CO, a relative gas production rate, CO2, a relative gas production rate, an initial value difference of winding short-circuit impedance, winding insulation dielectric loss, an initial value difference of winding capacitance, C2H2, a partial discharging amount, a gas content in oil, CH4, a neutral point oil flow static current, a furfural content, and a cardboard polymerization degree.

4. The transformer state evaluation method combining the FAHP method, the DEMATEL method, and the CRITIC method according to claim 1, wherein a method of obtaining the indicator subjective weights in the step two specifically comprises:

calculating the influencing degree and the influenced degree of indicators for the indicators under the factor layer by using the DEMATEL method, wherein a direct influence matrix A of the indicators is determined for the indicators under the factor layer by using an expert scoring method, and a variable a is an element in the direct influence matrix A;

performing normalization through $$G = A/\max_{1<i<n}\sum_{j=1}^{n} a_{ij}$$

to obtain a matrix G, wherein n is a number of the state quantity indicators under the factor layer; calculating a comprehensive influence matrix through $T=G(I-G)^{-1}$, wherein a variable t is an element in the comprehensive influence matrix T;

determining an influencing degree $f_i$ and an influenced degree $e_i$ through a formula $$f_i = \sum_{j=1}^{n} t_{ij}, e_i = \sum_{i=1}^{n} t_{ij},$$

wherein $f_i$ is a sum of row elements in the comprehensive influence matrix T, indicating a direct influencing degree or an indirect influencing degree of a state quantity indicator i on a state quantity indicator j, and $e_i$ is a sum of column elements in the comprehensive influence matrix T, indicating a value of the state quantity indicators corresponding to each row influenced by other state quantity indicators;

calculating a state quantity weight $W^1$ through the FAHP method, obtaining a relationship matrix between the influencing degree and the influenced degree through the DEMATEL method according to a formula d=fT*e, forming a vector of the influencing degree d=fT*e of the indicators through a diagonal line element, calculating the influencing degree of the indicator i, obtaining a corresponding weight $W^2$ through a formula $$W^2 = d_i / \sum_{i=1}^{n} d_i;$$

and
combining the DEMATEL method and the FAHP method, obtaining a weight W through a formula $W=W^1 \square W^2$, obtaining a comprehensive weight $\overline{W}$, which is the indicator subjective weight, after performing normalization.

5. The transformer state evaluation method combining the FAHP method, the DEMATEL method, and the CRITIC method according to claim 1, wherein a method of calculating the indicator objective weights in the step two specifically comprises:

selecting the plurality of groups of the transformers and the state quantities thereof; performing standardization processing on state quantity data of each of the transformers, wherein a formula thereof is: standardized quantity=(this value-lowest value)/(highest value-lowest value);

calculating a contrast intensity $\sigma_j$, conflict $R_j$, and an information amount $C_j$ through formulas provided as follows:

$$R_j = \sum_{i=1}^{n}(1 - r_{ij}) \text{ and}$$

$$C_j = \sigma_j R_j,$$

wherein the contrast intensity is a difference between a same indicator of different individuals, and a standard deviation is used to represent the contrast intensity $\sigma_j$; and obtaining an objective weight $W_j$ through calculating a formula provided as follows:

$$W_j = \frac{C_j}{\sum_{j=1}^{n} C_j},$$

wherein i and j represent the state quantities, n represents a total number of the state quantities, and $r_{ij}$ represents a correlation coefficient provided between the state quantities i and j.

6. The transformer state evaluation method combining the FAHP method, the DEMATEL method, and the CRITIC method according to claim 1, wherein a method of calculating the optimal weight in the step three specifically comprises:

calculating the optimal weight according to the indicator subjective weights and the indicator objective weights, which are obtained by calculating, based on a minimum-variance principle through a method of Lagrange multipliers for finding an extremum, wherein the total difference value between the weight vector obtained through the optimal weight and the weight vector obtained through each of methods is minimum, and a method of calculating the optimal weight is provided as follows, wherein a weight vector of a $j^{th}$ indicator of one weight calculation method is Wj=(Wj1, Wj2, Wj3, . . . , Wjn), a most reasonable attribute weight vector under weighting of two weight calculation methods is W=(W1, W2, W3, . . . Wm), m and n are both numbers of indicators of one factor layer, and a single-target planning model is accordingly built:

$$\begin{cases} \min P = \sum_{i=1}^{m}\sum_{k=1}^{s}\sum_{j=1}^{n}(a_k\lambda_{ki} - a_j\lambda_{ij})^2 \\ \sum_{k=1}^{s} a_k = 1 \end{cases};$$

and constructing a corresponding Lagrangian function, finding the extremum:

$$L(a,\lambda) = \sum_{i=1}^{m}\sum_{k=1}^{s}\sum_{j=1}^{n}(a_k u_{ki} - a_j u_{ij})^2 + \lambda\left(\sum_{k=1}^{s} a_k - 1\right)$$

wherein the following may be derived:

$$\frac{\partial L(a,\lambda)}{\partial a_k} = 2a_k\sum_{i=1}^{m}u_{ki}^2 - \left(a_1\sum_{i=1}^{m}u_{1i}u_{ki} + a_2\sum_{i=1}^{m}u_{2i}u_{ki}\right) + \frac{\lambda}{2} = 0 \text{ and}$$

$$\frac{\partial L(a,\lambda)}{\partial \lambda} = \sum_{t=1}^{s} a_t - 1 = 0,$$

when k=1 and 2, a system of equations formed by 3 unknowns and 3 equations is constructed, the two methods respectively account for a=(a1, a2) of the weighting after solving the system of equations, and an optimal weight vector is accordingly obtained.

7. The transformer state evaluation method combining the FAHP method, the DEMATEL method, and the CRITIC method according to claim 2, wherein a method of calculating the state scores in the step four specifically comprises:

calculating the state scores in the indicator layer according to data values of the transformers, which are to be evaluated, wherein a calculation expression for calculating the state scores in the indicator layer is provided as follows:

$$x_i = \frac{z - z_n}{z - z_f},$$

wherein $x_i$ is the state score of an indicator, when $x_i$<0, let $x_i$=0, when $x_i$>1, take $x_i$=1, z is an attention value, $z_n$ is an experimental value of this time, and $z_f$ is an initial value of the state quantity indicator; and calculating a state score $X_i$ of the factor layer through weighting by using known weights and the state scores of the indicator layer; and building a fuzzy determination matrix of the factor layer by using the state scores of the failure types of the factor layer, obtaining weights of the failure types of the factor layer according to the fuzzy determination matrix, finally obtaining the state scores of the transformers through weighting and calculating, wherein the fuzzy determination matrix of the failure types is:

$$R_A = \begin{pmatrix} r_{11} & r_{12} & \cdots & r_{1N} \\ r_{21} & r_{22} & \cdots & r_{2N} \\ \vdots & \vdots & & \vdots \\ r_{N1} & r_{N2} & \cdots & r_{NN} \end{pmatrix},$$

wherein a calculation formula of an internal element $r_{ij}$ is:

$$r_{ij} = \frac{X_i}{X_i + X_j}.$$

* * * * *